United States Patent
Martinez-Sanchez et al.

(10) Patent No.: US 10,450,086 B2
(45) Date of Patent: Oct. 22, 2019

(54) CHARGE CONTROL SYSTEM TO REDUCE RISK OF AN AIRCRAFT-INITIATED LIGHTNING STRIKE

(71) Applicant: Massachusetts Institute of Technology, Cambridge, MA (US)

(72) Inventors: Manuel Martinez-Sanchez, Lexington, MA (US); Carmen Guerra-Garcia, Cambridge, MA (US); Ngoc Cuong Nguyen, Lexington, MA (US); Jaime Peraire, Bedford, MA (US); Theodore Mouratidis, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 298 days.

(21) Appl. No.: 15/487,633

(22) Filed: Apr. 14, 2017

(65) Prior Publication Data
US 2017/0313438 A1    Nov. 2, 2017

Related U.S. Application Data

(60) Provisional application No. 62/330,305, filed on May 2, 2016.

(51) Int. Cl.
*G01R 29/08* (2006.01)
*B64D 45/02* (2006.01)

(52) U.S. Cl.
CPC ......... *B64D 45/02* (2013.01); *G01R 29/0842* (2013.01)

(58) Field of Classification Search
CPC .. H01T 23/00; G03G 15/0291; G03G 15/027; B03C 3/41

USPC ........................................................ 361/229
See application file for complete search history.

(56) References Cited

U.S. PATENT DOCUMENTS

| | | | |
|---|---|---|---|
| 2,386,647 A | 10/1945 | Andresen | |
| 3,427,504 A | 2/1969 | Cierva | |
| 4,216,519 A | 8/1980 | Boulay et al. | |
| 4,228,479 A | 10/1980 | Larigaldie et al. | |

(Continued)

FOREIGN PATENT DOCUMENTS

| | | |
|---|---|---|
| CN | 102222895 A | 10/2011 |
| GB | 1277429 A | 6/1972 |
| JP | 2004-324631 A | 11/2004 |

OTHER PUBLICATIONS

International Preliminary Report on Patentability dated Nov. 15, 2018 for Application No. PCT/US2017/029798.

(Continued)

*Primary Examiner* — Dharti H Patel
(74) *Attorney, Agent, or Firm* — Wolf, Greenfield & Sacks, P.C.

(57) ABSTRACT

System for reducing likelihood of an aircraft-induced lightning strike on an aircraft. The system includes a plurality of electric field sensors distributed on surfaces of the aircraft to monitor continuously the electrical environment to which the aircraft is subjected. A plurality of ion emission sources are distributed on selected aircraft surfaces, the ion emission sources adapted to emit either positive or negative ions. A computer runs an algorithm to control net charge level of the aircraft by commanding the emission of positive or negative ions from selected surfaces to retard inception of corresponding leader discharges.

34 Claims, 2 Drawing Sheets

(56) References Cited

U.S. PATENT DOCUMENTS

| | | | | |
|---|---|---|---|---|
| 4,323,946 | A * | 4/1982 | Traux | H05F 3/00 |
| | | | | 244/1 A |
| 4,886,221 | A | 12/1989 | Honigsbaum | |
| 4,980,795 | A | 12/1990 | Moore et al. | |
| 6,069,314 | A | 5/2000 | Varela | |
| 6,362,574 | B1 * | 3/2002 | Aguero | B64G 1/54 |
| | | | | 244/171.7 |
| 6,980,410 | B2 | 12/2005 | Kent | |

OTHER PUBLICATIONS

Notification of the Transmittal of the International Search Report and the Written Opinion of the International Searching Authority for PCT/US2017/029798 dated Aug. 9, 2017.
Gallimberti, The mechanism of the long spark formation. Journal de Physique Colloques, 1979, 40 (C7), pp. C7-193-C7-259.
Cooray, The Lightning flash, 2nd edition. IET power and Energy series 69, 2014.
Castellani et al, Laboratory study of the bi-leader process from an electrically floating conductor. Part 2: bi-leader properties. IEE Proceedings, Science Measurement and Technology, 1996, 145 (5) pp. 193-199.
Jones, Electric charge acquired by airplanes penetrating thunderstorms. Journal of Geophysical Research, 1990, 95 (D10) pp. 16589-16600.
Vonnegut et al, Adjustable potential-gradient-measuring apparatus for airplane use. Journal of Geophysical Research, 1961, vol. 66, p. 2393-2397.
De La Mora, The fluid dynamics of Taylor cones. Journal of Fluid Mechanics, 2007, vol. 39, p. 217-243.
Perez-Martinez et al, Ionic liquid ion sources as a unique and versatile option in FIB application. Microelectronic Engineering, 2011, 88(8), p. 2088-2091.
Guerra-Garcia et al, Spatial uniformity of the current emitted by an array of passively fed electrospray porous emitters. Journal of Physics D: Applied Physics, 2016, vol. 49, p. 115503-115515.
Larsson, The interaction between a lightning flash and an aircraft in flight. Comptes Rendus Physique, 2002, vol. 3, p. 1423-1444.
Mach et al, General matrix inversion technique for the calibration of electric field sensor arrays on aircraft platforms. Journal of Atmospheric and Oceanic Technology, 2007, vol. 24, p. 1576-1587.
Winn, Aircraft measurement of electric field: self-calibration. Journal of Geophysical Research, 1993, vol. 98(D4), p. 7351-7365.
Koshak, Retrieving storm electric fields from aircraft field mill data. Part I: Theory. Journal of Atmospheric and Oceanic Technology, 2006, vol. 23, p. 1269-1302.
Anderson et al, Vector electric fields measured in a lightning environment. NRL Memorandum Report 1987, p. 5899.
Lalande et al, Computations of the initial discharge initiation zones on aircraft or helicopter. SAE Technical paper series 1999-01-2371, reprinted from Proceedings of the 1999 International Conference on Lightning and Static Electricity (ICOLSE), 1999.
Zaglauer et al, A simplified model for the determination of initial attachment zones via electric field modeling—parameter studies and comparisons. SAE Technical paper series 1999-01-2375, reprinted from Proceedings of the 1999 International Conference on Lightning and Static Electricity (ICOLSE), 1999.

* cited by examiner

CHARGE CONTROL SYSTEM TO REDUCE RISK OF AN AIRCRAFT-INITIATED LIGHTNING STRIKE

This application claims priority to U.S. Provisional Application Ser. No. 62/330,305 filed on May 2, 2016, the content of which is incorporated herein by reference in its entirety.

BACKGROUND OF THE INVENTION

This invention relates to aircraft protection, and more particularly, to a charge control system to reduce the risk of a lightning strike on an aircraft.

On average, a civil air is struck by lightning at least once per year. The probability of an aircraft being struck while airborne is much higher than that of a stationary aircraft on a runway. Part of the reason is that the aircraft modifies the electric fields in the vicinity which acts as a catalyst for lightning inception and attachment. Specifically, an aircraft located in an electric field becomes polarized and the local electric field values at the aircraft surface are magnified at the extremities where the radius of curvature of the conducting structure is smaller, such as on wing tips, stabilizer tips aircraft nose, etc. The foregoing applies to both fully metallic aircraft and aircraft with a substantial past of their structural material made of composites so long as copper mesh or expanded foil is embedded in the structural material to ensure high electrical conductivity. This electric field enhancement can result in the development of a bi-directional leader extending from opposite polarity aircraft extremities, which may eventually connect with oppositely charged regions in a cloud or ground. Through this process, the aircraft triggers a lightning strike with itself being in the direct path of the return stroke current flowing between the attachment locations. See, FIG. 1 that shows the sequential limitation of a positive leader followed by a negative leader in a sufficiently high electric field.

It is an object of the present invention to provide a system for minimizing the likelihood that leaders will form that can result in a lightning strike.

SUMMARY OF THE INVENTION

The system disclosed herein for reducing likelihood of an aircraft-induced lightning strike on an aircraft in a region of high ambient electric field includes a plurality of electric field sensors distributed on surfaces of the aircraft to monitor continuously the electrical environment to which the aircraft is subjected. A plurality of ion emission sources are distributed on selected surfaces of the aircraft, the ion emission sources adapted to emit either positive or negative ions as required. A computer, preferably located in the aircraft, runs a series of algorithms to retrieve the ambient electric field and aircraft net charge from the measurements of the electric field sensors; to evaluate the safety margins for positive and negative leader formation; and to control the net charge level of the aircraft by commanding the emission of positive or negative ions at the selected surfaces to retard inception of corresponding leader discharges.

In a preferred embodiment, the electric field sensors are positioned so that one of the 3 spatial components of the external field or the net charge dominate in at least one sensor. In a preferred embodiment, a minimum of 4 electric field sensors are used. In a preferred embodiment, the ion emitters are located at the downstream extremities of the airplane which include antennas and VHF blades, trailing edges of wing tips, trailing edges of vertical and horizontal stabilizer tips, and tail cone. In a preferred embodiment, if conditions are such that a positive leader is likely to occur, one or several ion emission sources emit positive ions at one or several selected surfaces. In contrast, if conditions are such that a negative leader is likely to occur, one or several ion emission sources emit negative ions at one or several selected surfaces. In a preferred embodiment, the electric field sensors are electric field mills. In a preferred embodiment, the ion emission sources are high-voltage stinger probes, with the high voltage terminal of an onboard power supply ending in a corona discharge exposed to the wind and the low voltage terminal connected to the aircraft frame; electrospray sources; or ionic liquid ion sources forming a compact array.

DESCRIPTION OF THE PREFERRED EMBODIMENT

Figure 1:
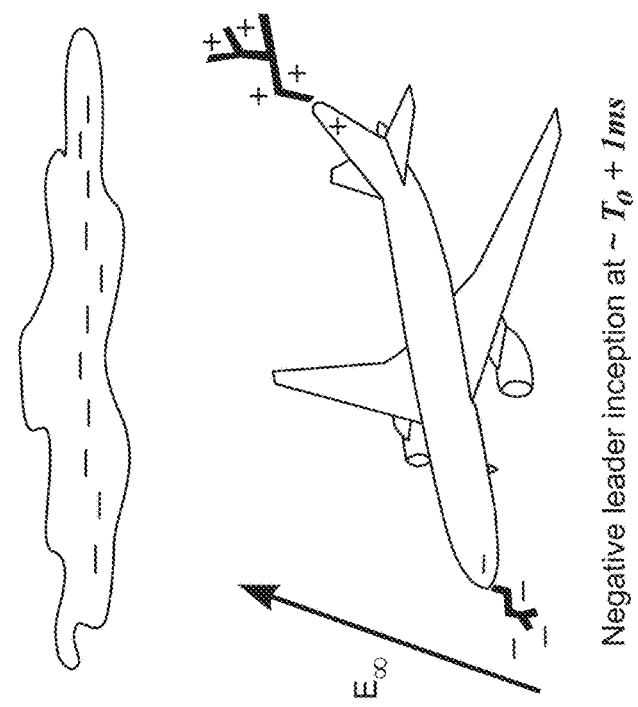
FIG. 1 is a schematic illustration showing the typical sequential limitation of positive and negative leaders when an airplane flies through an electric field that triggers lightning.
Figure 1:
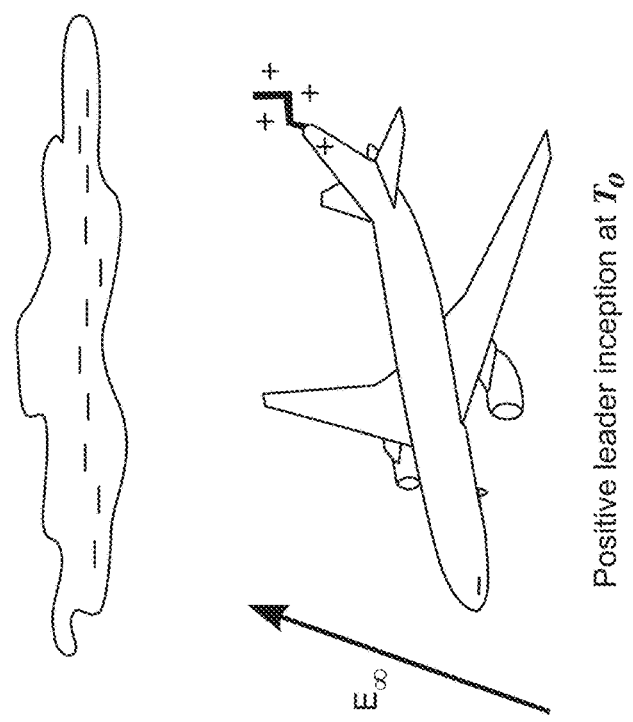

It is generally accepted that the majority of lightning strikes to aircraft are triggered by the aircraft itself [Larsson2002] as it penetrates a region of high ambient electric field or is subjected to a rapid rise in the electric field to which it is exposed. According to [Lalande1999] the critical ambient field leading to lightning initiation ranges from 90 kV/m to 300 kV/m (calculated fields at mean sea level conditions), for a narrow body commercial airplane.

In this sense, lightning would most likely not have happened in the absence of the aircraft. This is the case because as a conductive aircraft penetrates a region of high electric field, it becomes polarized, with one end becoming positively charged and the other end becoming negatively charged, even under zero net charge conditions. This effect significantly enhances the electric field on the aircraft's surface and its vicinity. For example, the presence of a convex metallic object intensifies the electric field on its surface by factors that range from 2 (for a cylinder) or 3 (for a sphere) to something of the order of l/d for an elongated object of length l and diameter d. This field intensification is due to the accumulation of charge at the object's ends as required to counter the external field on the aircraft. For an aircraft flying below the clouds, most of the time, a cloud base is negative with respect to ground so a positive (upwards) field E develops. In this scenario, convex surfaces on the aircraft (e.g. an airplane) that face upwards, such as the tip of the empennage or the top of the fuselage, accumulate positive surface charge in response, while surfaces facing down accumulate negative surface charge in the same amount (for an uncharged aircraft). For an aircraft flying close to the clouds, the ambient electric field E can take any orientation. In this scenario, still one side of the aircraft will accumulate positive charge and the other negative charge, the summation of these charges amounting to the net charge of the aircraft (zero in the case of an uncharged aircraft). In general, the polarity of different strikes of the aircraft and their charge level depend on the orientation and amplitude of the external field, as well as the net charge of the aircraft.

As the electric fields on the aircraft's surface and its vicinity intensify, localized streamer corona discharges can develop and, if further stressed, the streamers may coalesce into self-propagating leader channels. In general, two leaders of opposite polarity form from the aircraft prior to the lightning strike. However, once the first leader forms, formation of the second leader is imminent and occurs several milliseconds later as propagation of the first leader biases the electric potential of the aircraft in the direction that favors the formation of the leader of opposite polarity. The discharge is now bi-directional, and both branches propagate until they connect with ground and cloud, or sometimes with two clouds of opposite polarity, thus initiating the destructive first return stroke of a lightning arc. Other strokes may then follow along the same channel.

There is a definite order to this process because the crucial breakdown field in air is known to be around twice as large on the negative side as compared to the positive side, and the conditions for negative leader formation are generally more demanding than for the positive leader. Therefore, under most circumstances, a positive leader typically develops first which drains positive charge from the aircraft and shifts its potential in the negative direction, until the conditions at the negative end are sufficient to initiate a sell-propagating negative leader a few milliseconds later (FIG. 1).

The charge control system described in this invention exploits this asymmetry between the positive and the negative leader inception to reduce the risk of an aircraft-initiated lightning strike. The system acts to suppress the inception of the first leader while ensuring that a leader of opposite polarity does not form.

In a preferred embodiment, the charge control system to reduce risk of an aircraft-initiated lightning strike (FIG. 2) consists of electric field sensors 12, a series of algorithms run on the computer 16 preferably carried on the aircraft 10, and ion emitters 14. The purpose and details of each of these elements are described in what follows.

Figure 2:
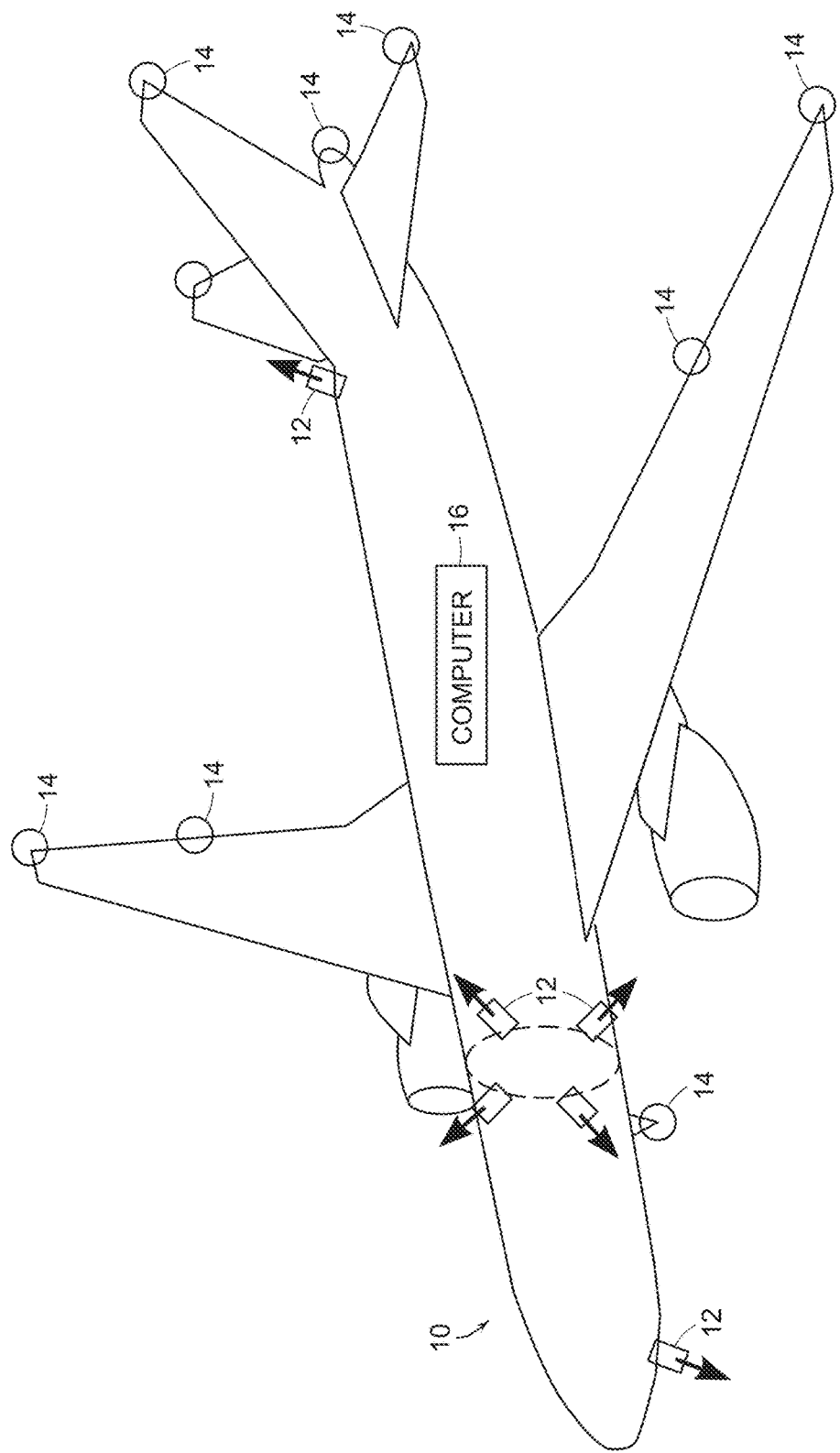
FIG. 2 is a schematic view of an airplane showing representative locations of electric field sensors and ion emission sources distributed on the airplane.

With reference now to FIG. 2 an aircraft 10 has distributed on its surface onboard electric field, sensors 12 indicated by rectangles on the figure. In the figure, the arrows indicate the electric field sensors' orientations. At least four electric field sensors are required to be able to determine the 3 spatial components of the external vector electric field plus the net aircraft charge from the electric fields measured by the sensors. However, at, least six sensors are preened for better accuracy. Proper location of the electric field sensors is required to unambiguously determine the external field and net aircraft charge. Preferred placement of the electric field sensors 12 requires that each of the 3 spatial components of the external field, relative to an aircraft reference frame, or the net charge dominate in at least one sensor. An example placement of the electric field sensors in an airplane is shown in FIG. 2, as recommended by [Mach2007]. Other preferred placements for airplanes include the wing tips, belly centerline near the nose and near the tail [Anderson1984]. The 3 spatial components of the external field ($E_x$, $E_y$, $E_z$) as well as the aircraft net charge Q (or equivalently its electric potential) will be retrieved from the electric fields measured locally by the sensors 12 using an algorithm run on the computer 16 preferably carried on the aircraft 10. The algorithm continuously retrieves the external electric field and aircraft net charge from a previously calibrated matrix (which depends on the aircraft geometry and the location of the sensors 12) and the individual instrument responses. Possible algorithms and calibration procedures have been reported in the literature [Mach2007, Winn1993, Koshak2006]. Suitable electric field sensors are rotating shutter field meters, called electric field mills or which are described elsewhere [Winn1993].

From the inferred instantaneous external field and aircraft net charge, another algorithm run on the computer 16 preferably carded on the aircraft 10 will determine the likelihood of positive and negative leader inception from corresponding select aircraft surfaces. These surfaces should at least include: the aircraft nose, antennas and VHF blades, leading and trailing edges of wing tips, vertical and horizontal stabilizer tips, tail cone, and engine nacelles. The algorithm will determine the probability of leader inception of either polarity based on best-known literature methods [Lalande1999, Zaglauer1999]. Note that the inception thresholds for either polarity are different and it is precisely this asymmetry that is exploited. E.g., a possible leader inception model is based on a critical equivalent charge concept: if the calculated corona charge exceeds a certain threshold, a leader is incepted [Gallimberti1979, Cooray2014]. Experimental results [Castellani1998] show that an equivalent critical charge for the negative leader is approximately 4 times higher than for the positive leader (in magnitude). Critical electric fields necessary for the propagation of streamer discharges that precede leader formation are around two times higher for the negative polarity than for the positive polarity.

From this information, yet another algorithm (the charge control algorithm) run on the computer 16 preferably carried on the aircraft 10 calculates the optimum net charge of the aircraft required to keep equal safety margins for the positive and negative discharges, thereby reducing the likelihood of a lightning strike. Depending on the predicted optimum net charge level, the ion emitters 14 are activated to force this optimum charge condition. As an example, suppose that the algorithm just described indicates that there is an X % safety margin for the positive discharge (i.e. an increase of X % in the ambient field would to a positive leader from the positive end of the aircraft) and a 3X % safety margin for the negative discharge (i.e., an increase of 3X % in the ambient field would trigger a negative leader from the negative end of the aircraft). In this situation, the ion emitters 14, shown by circles. In FIG. 2, are activated to emit positive charge from one or several of the ion emitters 14 located on the positive region of the aircraft. As a consequence of the positive charge emission, the aircraft acquires negative charge and the negative side of the aircraft will see its negative field intensified. The positive ion emission process continues until the algorithm indicates equal safety margins, Y %, for both the positive and negative leaders. Necessarily Y is greater than X and smaller than 3X, due to the asymmetry of the leaders, thus reducing the likelihood of a lightning strike.

It should be appreciated that the strategy set out above is based on the lack of symmetry in the inception of the two leaders as shown in FIG. 1. Of course, there can be situations where the negatively polarized area presents more pointed protuberances, or there is excess negative net charge on the aircraft so that negative and positive leaders are equally likely. In that case, the algorithm will predict that the optimum net charge coincides with the actual aircraft net charge level, and the ion emitters 14 will not be activated since any ion emission would be undesirable. But in the opposite limit, with negative leader inception being actually more likely, the algorithm would predict an optimum charge level greater than the actual one. In this situation, the ion emitters 14 will be activated to inject negative ions from those emitters located at the negative side of the aircraft, so that the net charge of the aircraft becomes more positive.

More generally, the optimum level of aircraft charging is that which makes both polarity leaders equally unlikely. Assuming proper electric field sensor instrumentation, this level can be continuously tracked. Incidentally, this strategy would be of use even in the absence of storm fields because aircraft can become charged, of either polarity, for other reasons such as flight through dust or ice particle fields. Preexisting positive charge is particularly damaging if the aircraft then flies into a storm area.

Regarding requirements on the emitters, the optimum net charge levels for a business jet size airplane are estimated on the order 0.1-0.5 mC for a wide range of conditions (typically of negative polarity). A typical airliner flies about 250 m in one second and this may be of the order of the motion required to enter the area of influence of a cloud charge center. If a one second ion-evacuation time is assumed, the ion current required is 100-500 μA. Moreover, if the potential bias for ion emission is of the order of 1 kV, the required power is of the order of 0.1-0.5 W. Faster ion-evacuation times may be needed to counter fast raises in the ambient electric field, and in this situation higher ion currents will be required. A higher current can be achieved by activating a larger number of ion emitters 14 or by increasing the current level of each individual emitter.

With reference to FIG. 2 an aircraft 10 has distributed on its surface on-board ion emitters 14 indicated by circles on the figure. Ion emitters should be placed in pairs. A pair constitutes a positive ion emitter and a negative ion emitter. For some preferred embodiments a single ion emitter able to operate in both polarities should be used at each location. Ion emitters 14 are preferentially placed at the downstream extremities of the aircraft which can include but are not limited to: antennas and VHF blades, trailing edges of wing tips, trailing edges of vertical and horizontal stabilizer tips, and tail cone. These locations are selected to facilitate the convection of the emitted ions away from the aircraft by the airflow.

The charge control algorithm run on the computer 16 preferably carried on the aircraft 10 will activate those ion emitters 14 located on the positive side of the aircraft, if positive ion emission is required; or alternatively, on the negative side of the aircraft, if negative ion emission is required. E.g. in the case of positive ion emission, since the adjacent surface is positively biased, the ions will be immediately subjected to threes that pull them farther away from the aircraft. This repulsion forces combined to the sweeping of the airflow will reduce the possibility of ion return to the aircraft and thus facilitate the ion evacuation process. In general, reaching a required optimum net charge level in a given time can be adjusted through the number of ion emitters activated at each time or through the individual current levels of each of the emitters 14.

Suitable ion emitters to artificially charge an aircraft are high-voltage stinger probes producing coronas [Koshak2006, Vonnegut1961, Jones1990] and electrospray sources [FernandezMora2007], including ionic liquid ion sources [Perez2011].

The high-voltage stinger probe ion emitters require an onboard high voltage power supply (of the order of 1-10 kV) with the high voltage terminal connected to a cable which terminates in a point or brush that produces a corona discharge exposed to the airstream. The low voltage terminal is connected to the airframe [Jones1990]. The polarity of the high voltage is positive for positive ion emission and negative for negative ion emission. The currents emitted by each on of these emitters are of the order of 10 μA but can be increased through the geometry of the exposed electrode, the number of filaments in the brush or the level of voltage applied.

Ion emitters based on electrospray principles rely on the emission of charged particles: either charged droplets (colloid), pure ions or a mixture of both from the apex of an electrified liquid [FernandezMora2007]. In particular, ionic liquid ion sources [Perez2011] can emit ions of either positive or negative value with currents up to 1 μA. In order to increase the current to usable levels, the emitters can be multiplexed in the form of arrays. E.g. small ionic liquid micro-arrays made at the Massachusetts Institute of Technology can emit about 150 μA each with a unit area of about 1 $cm^2$, and this can be accomplished using a 1 kV bias [Citierra2016]. Note that these emitters in particular are designed for vacuum operation and equivalent sources would need to be developed for atmospheric operation. Both polarities of ions can be emitted with essentially similar bias levels. It is worth noting that the ion creation process for these sources does not involve creating of a plasma that could possibly enhance surface breakdown; instead, ions are directly extracted from an ionic liquid and are not themselves ionization sources for the ambient air.

The content of all of the references cited herein is incorporated by reference.

It is recognized that modifications and variations of the present invention will be apparent to those of ordinary skill in the art, and it is intended that all such modifications and variations be included within the scope of the appended claims.

REFERENCES

[Mach2007] Mach M, Koshak W J. General matrix inversion technique for the calibration of electric field sensor arrays on aircraft platforms. Journal of atmospheric and oceanic technology 24 pp. 1576-1587, 2007

[Winn1993] Winn W P. Aircraft measurement of electric field: self-calibration journal of geophysical research 98(D4) pp. 7351.3365, 1993

[Koshak2006] Koshak W J. Retrieving storm electric fields from aircraft field mill data. Part I: Theory. Journal of atmospheric and oceanic technology 23 pp. 1289-1302, 2006

[Anderson1987] Anderson R V, Bailey J C. Vector electric fields measured in a lightning environment, NRL Memorandum Report 5899, 1987

[Lalande1999] Lalande P, Bondiou-Clergerie, Laroche P, Computations of the initial discharge initiation zones on aircraft or helicopter. SAE Technical paper series 1999-01-2371 reprinted from Proceedings of the 1999 International Conference on Lightning and Static Electricity (ICOLSE), 1999

[Zaglauer1999] Zaglauer H W, Wulbrand W. A simplified model for the determination of initial attachment zones via electric field modeling—parameter studies and comparisons, SAE Technical paper series 1999-01-2375, reprinted from Proceedings of the 1999 International Conference on Lightning and Static Electricity (ICOLSE), 1999

[Gallimberti1979] Gallimberti I. The mechanism of the long spark formation. Journal de Physique Colloques 40 (C7) p C7-193-C7-259, 1979

[Cooray2014] Cooray V. The Lightning flash, $2^{nd}$ edition, IET power and Energy series 69, 2014

[Castellani1998] Castellani A, Bondiou-Clergerie A, Lalande P, Bonamy A, Gallimberti I. Laboratory study of the bi-leader process from an electrically floating conductor, Part 2: bi-leader properties, IEE Proc. Sci. Meas. Technol. 145 (5) pp. 193-199, 1998

[Jones1990] Jones J. J. Electric charge acquired by airplanes penetrating thunderstorms, Journal of geophysical research 95(D10) pp. 16589-16600, 1990

[Vonnegut1961] Vonnegut B, Moore B C, Mallahan F J. Adjustable potential-gradient-measuring apparatus for airplane use. Journal of geophysical research 66 pp. 2393-2397, 1961

[FernandezMora2007] Fernandez de la Mora J. The fluid dynamics of Taylor cones, J. Fluid Mech. 39 217-43, 2007

[Perez2011] Perez-Martinez C, Guilet S, Gierak J, Lozano P. Ionic liquid ion sources as a unique and versatile option in FIB applications. Microelectronic Engineering, 88(8) pp. 2088-2091, 2011

[Guerra2016] Guerra-Garcia C, Krejci D, Lozano P. Spatial unitbrmity of the current emitted by an array of passively fed electrospray porous emitters, J. Phys. D: Appl. Phys. 49 115503 (12 pp), 2016

[Larsson2002] Larsson A. The interaction between a lightning flash and an aircraft in flight. C. R. Physique 3 pp. 1423-1444, 2002

What is claimed is:

1. A system for reducing likelihood of an aircraft-induced lightning strike on an aircraft in an atmosphere of high ambient electric field comprising:
    a plurality of electric field sensors distributed on surfaces of the aircraft to monitor the electrical environment to which the aircraft is subjected;
    a plurality of ion emission sources distributed on one or more of the surfaces of the aircraft, the plurality of ion emission sources configured to emit positive and/or negative ions;
    a computer configured to retrieve an external electric field and aircraft net charge from the plurality of electric field sensors;
    the computer also configured to evaluate a safety margin for positive and negative leader inception from the one or more surfaces of the aircraft based at least partly on the retrieved external electric field and aircraft net charge; and
    the computer also configured to control the aircraft net charge by commanding the emission of positive and/or negative ions from the plurality of ion emissions sources to retard inception of positive and/or negative leader discharges.

2. The system of claim 1, wherein the one or more of the surfaces include at least one selected from the group of trailing edges of wingtips, trailing edges of tips of vertical and horizontal stabilizers, antennas and VHF blades, and a tail cone.

3. The system of claim 1, wherein the plurality of electric field sensors is at least four electric field sensors.

4. The system of claim 1, wherein the plurality of electric field sensors are located so that each of three components of the external electric field or the aircraft net charge dominates in at least one of the plurality of electric field sensors.

5. The system of claim 1, wherein the safety margin of positive and negative leader inception is evaluated at the surfaces which include the aircraft nose, antennas and VHF blades, leading and trailing edges of wing tips, vertical and horizontal stabilizer tips, tail cone, and engine nacelles.

6. The system of claim 1, wherein the computer is configured to command the emission of positive ions from one or more of the plurality of ion emissions sources before a positive leader inception threshold is reached.

7. The system of claim 1, wherein the computer is configured to command the emission of negative ions from one or more of the plurality of ion emissions sources before a negative leader inception threshold is reached.

8. The system of claim 1, wherein the computer is configured to command the emission of positive or negative ions from one or more of the ion emissions sources to adjust the aircraft net charge level so that inception of a positive and a negative leader have an equal probability.

9. The system of claim 1, wherein if a positive leader is more likely to occur than a negative leader, the computer is configured to command one or more of the plurality of ion emission sources to emit positive ions at one or more of the surfaces.

10. The system of claim 1, wherein if a negative leader is more likely to occur than a positive one, the computer is configured to command one or more of the ion emission sources to emit negative ions at one or more of the surfaces.

11. The system of claim 1, wherein the computer is configured to adjust a rate of aircraft net charge accumulation by adjusting a number of the plurality of ion emission sources that are activated.

12. The system of claim 1, wherein the computer is configured to adjust a rate of aircraft net charge accumulation by adjusting a current of each individual ion emitter.

13. The system of claim 1, wherein the computer is configured to command the emission of positive ions on positively charged surfaces of the aircraft.

14. The system of claim 1, wherein the computer is configured to command the emission of negative ions on negatively charged surfaces of the aircraft.

15. The system of claim 1, wherein the electric field sensors are electric field mills.

16. The system of claim 1, wherein the ion emission sources are mounted in pairs: a positive ion emitter and a negative ion emitter.

17. The system of claim 1, wherein the ion emission sources are configured to operate in both positive and negative polarity.

18. The system of claim 1, wherein the ion emission sources are ionic liquid ion sources.

19. The system of claim 1, wherein the ion emission sources are ionic liquid micro-arrays.

20. The system of claim 1, wherein the ion emission sources are electrospray sources.

21. The system of claim 1, wherein the ion emission sources are high voltage stinger probes based on corona emission.

22. The system of claim 1, wherein the ion emission sources are substituted by charged droplet or colloidal emission sources.

23. The system of claim 1, wherein the ion emission sources emit a combination of pure ions and charged droplets.

24. The system of claim 1, wherein the computer is carried on the aircraft.

25. The system of claim 1, wherein the computer is not carried on the aircraft, and wherein the computer is configured to communicate with the aircraft.

26. The system of claim 1, wherein the aircraft is an airplane.

27. The system of claim 1, wherein the aircraft is a helicopter.

28. The system of claim 1, wherein the aircraft is a drone.

29. The system of claim 1, wherein the aircraft is any type of conductive airborne vehicle.

30. The system of claim 1, wherein the computer is configured to command one or more of the plurality of ion emissions sources located on a positive polarity surface to emit positive ions, and wherein the computer is further configured to simultaneously command one or more of the plurality of ion emissions sources located on a negative polarity surface to emit negative ions.

31. A system for reducing likelihood of an aircraft-induced lightning strike on an aircraft in an atmosphere of high ambient electric field comprising:
- a plurality of electric field sensors distributed on a plurality of surfaces of the aircraft to measure a local electric field at each one of the plurality of surfaces;
- a plurality of ion emission sources distributed on the plurality of surfaces of the aircraft, wherein the plurality of ion emission sources are configured to emit positive and/or negative ions; and
- a computing device which receives the local electric field measurements from each of the electric field sensors, wherein the computing device is configured to:
  - determine a net charge of the aircraft based on the local electric field measurements;
  - determine a probability of positive and/or negative leader inception from the plurality of surfaces based at least partly on the measured local electric field and the net charge of the aircraft; and
  - command one or more of the plurality of ion emission sources to emit ions to reduce the probability of positive and/or negative leader inception based on the determined probability.

32. The system of claim 31, wherein the computing device is configured to determine a polarity of each one of the plurality of surfaces based on the local electric field measurements.

33. The system of claim 32, wherein the computing device is configured to command ion emissions sources located on a positive polarity surface to emit positive ions, and wherein the computing device is further configured to simultaneously command ion emissions sources located on a negative polarity surface to emit negative ions.

34. A method for reducing likelihood of an aircraft-induced lightning strike on an aircraft in an atmosphere of high ambient electric field, the method comprising:
- measuring a local electric field at a plurality of surfaces of the aircraft;
- determining a net charge of the aircraft based on the local electric field measurements;
- determining a probability of positive and/or negative leader inception from the plurality of surfaces based at least partly on the measured local electric fields and the net charge of the aircraft; and
- emitting ions to reduce the probability of positive and/or negative leader inception based on the determined probability.

* * * * *